(12) United States Patent
Nemanick et al.

(10) Patent No.: US 11,289,757 B2
(45) Date of Patent: Mar. 29, 2022

(54) RADIOISOTOPE THERMOELECTRIC BATTERY (RTB) SYSTEM

(71) Applicant: The Aerospace Corporation, El Segundo, CA (US)

(72) Inventors: Eric Joseph Nemanick, Santa Monica, CA (US); Henry Helvajian, Pasadena, CA (US); Brian Shen, Hawthorne, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 572 days.

(21) Appl. No.: 16/654,105

(22) Filed: Oct. 16, 2019

(65) Prior Publication Data
US 2021/0119283 A1 Apr. 22, 2021

(51) Int. Cl.
| | |
|---|---|
| *H01M 10/0525* | (2010.01) |
| *H01M 10/615* | (2014.01) |
| *H01M 10/653* | (2014.01) |
| *H01M 10/46* | (2006.01) |
| *H01M 10/66* | (2014.01) |
| *H01L 35/32* | (2006.01) |
| *H01M 10/659* | (2014.01) |
| *H01M 10/0562* | (2010.01) |

(52) U.S. Cl.
CPC .......... *H01M 10/66* (2015.04); *H01L 35/32* (2013.01); *H01M 10/0525* (2013.01); *H01M 10/0562* (2013.01); *H01M 10/46* (2013.01); *H01M 10/615* (2015.04); *H01M 10/653* (2015.04); *H01M 10/659* (2015.04); *H01M 2300/0074* (2013.01)

(58) Field of Classification Search
CPC ............ H01M 10/66; H01M 10/0525; H01M 10/0562; H01M 10/46; H01M 10/615; H01M 10/653; H01M 10/659; H01M 2300/0074; H01L 35/32; Y02E 60/10
See application file for complete search history.

(56) References Cited

U.S. PATENT DOCUMENTS

| | | | | |
|---|---|---|---|---|
| 2,900,535 A | * | 8/1959 | Thomas ................... | H01M 6/00 310/302 |
| 3,321,646 A | * | 5/1967 | Pidd ......................... | G21D 7/02 376/321 |
| 3,857,738 A | * | 12/1974 | Brown ................... | G21H 1/103 136/202 |
| 2013/0084474 A1 | * | 4/2013 | Mills ................... | H01M 10/399 429/9 |

(Continued)

FOREIGN PATENT DOCUMENTS

| | | | | |
|---|---|---|---|---|
| CN | 106876617 A | * | 6/2017 | .......... H01M 10/615 |
| FR | 2941095 A1 | * | 7/2010 | .......... H01M 10/615 |
| WO | WO-2012094674 A2 | * | 7/2012 | ............ B60L 53/302 |

*Primary Examiner* — Kaity V Chandler
(74) *Attorney, Agent, or Firm* — LeonardPatel PC

(57) ABSTRACT

Describe herein is an energy storage system that includes a battery and a heat source. The battery harvests waste heat from the heat source to keep itself warm while storing electrical energy generated from a heat to energy transforming source. If the heat source is radioactive (e.g. radioisotope decay) a radiation hard battery is intimately connected to a waste heat source. The radiation hard battery harvests waste heat from the heat source to warm itself and to shield the radiation.

19 Claims, 3 Drawing Sheets

(56) References Cited

U.S. PATENT DOCUMENTS

2018/0108956 A1* 4/2018 Fortenbacher ...... H01M 10/615
2019/0115162 A1* 4/2019 Goodenough .... H01M 10/0562
2021/0119283 A1* 4/2021 Nemanick ........... H01M 10/659

* cited by examiner

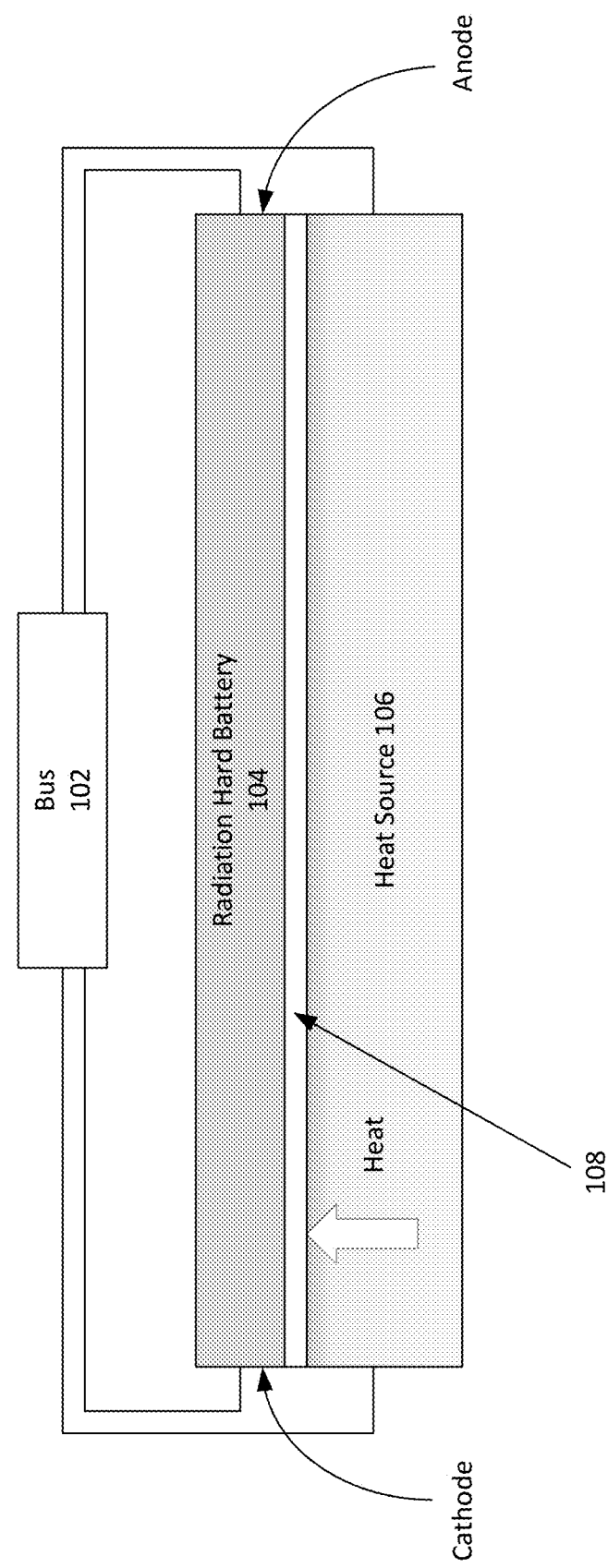

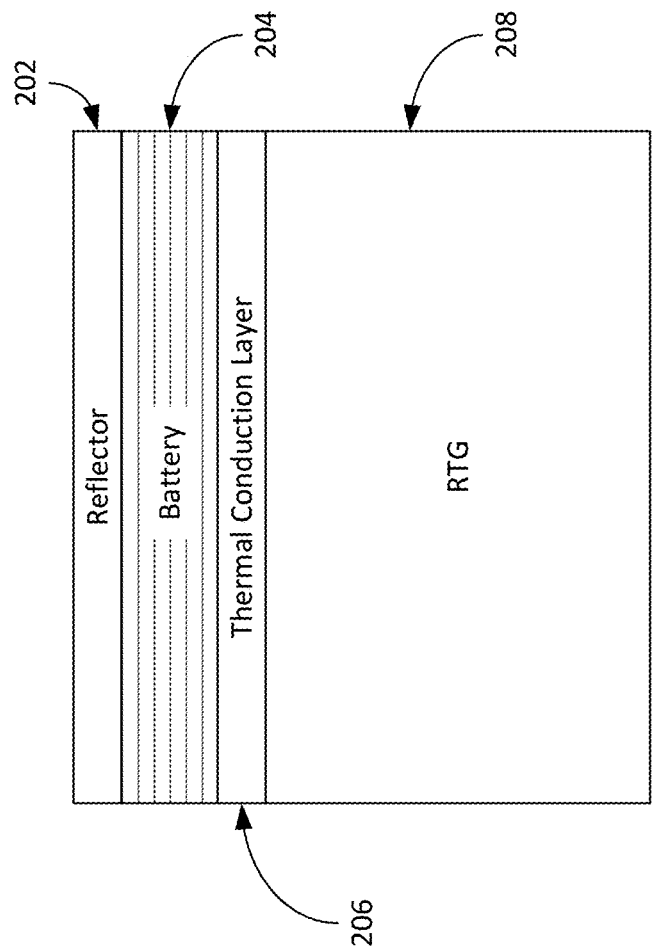

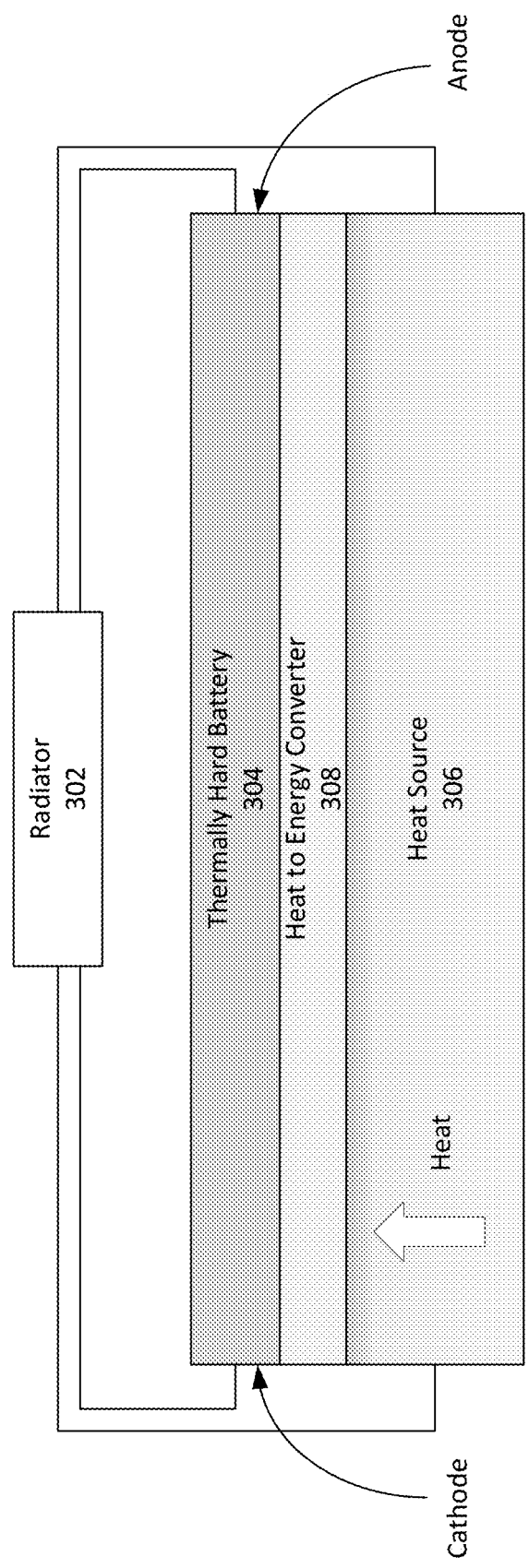

RADIOISOTOPE THERMOELECTRIC BATTERY (RTB) SYSTEM

FIELD

The present invention relates to a battery system, and more particularly, to harvesting electrical and/or thermal waste energy to power a battery system.

BACKGROUND

For applications, that do not, or cannot, use a solar or chemical power source, radioisotope thermopower generators (RTGs) are used as a power source. A RTG uses the heat generated from radio isotope decay through a converter to generate electrical power. The electrical power is continuously delivered but constantly decreases with the total decaying mass of the radio isotope. For a RTG application, the RTG is sized for the power need at end of application life. The typical isotope used is plutonium 238. Plutonium 238 has a half-life of 87.7 years and for even a 10-year application, there is a fractional reduction in the output that must be planned for. Many other radioisotopes decay at a faster rate giving sharper declines in available power at the end of the application.

For electronics applications that use a RTG, the electronics and energy storage components are placed far away from the RTG due to the radiation (alpha, beta, neutrons) being emitted from the radioisotope decay. If that is not feasible, then the electronics or energy storage systems are heavily shielded (usually massive high Z metals). The heavy shielding of the energy storage system increases the overall system mass, which is deleterious for any portable application. When using a RTG power source, the design either sizes the RTG for the maximum potential power need or there is an onboard battery that supplies the needed extra energy stored from previous surplus power production. In the latter case and for space applications, the battery must not only be protected from the radiation but also kept warm. Traditional engineering approaches are to install heaters on the batteries to mitigate freezing of the battery, which increases system mass and adds additional power draw.

An alternative approach is a system that combines a radiation hard battery with the RTG to not only continuously charge the battery by the trickle charge emanating from the RTG but also use the excess heat from the RTG to keep the battery warm. The radiation hard battery can be combined with the RTG in such a way that the battery's own mass also serves as radiation shielding for other vulnerable parts of the system.

SUMMARY

Certain embodiments of the present invention may provide solutions to the problems and needs in the art that have not yet been fully identified, appreciated, or solved by current battery storage systems.

In an embodiment, a power generation/storage system includes a battery intimately connected to a heat source. The battery is configured to harvest waste heat from the heat source, warming the battery. The battery also stores electrical energy produced by a thermoelectric or other heat engine.

In another embodiment, a power generation/energy storage system includes a radiation hard battery intimately connected to a waste heat source. The radiation hard battery is configured to harvest waste heat from the heat source, warming the radiation hard battery. The radiation hard battery also stores electrical energy produced by a thermoelectric or other heat engine.

In yet another embodiment, a battery system includes a bus connected to a radiation hard battery and a radioisotope power source. The radiation hard battery is connected to the radioisotope power source, such that heat generated from the radioisotope power source is converted into energy and stored into the radiation hard battery.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 1 is a diagram illustrating a battery system, according to an embodiment of the present invention.

FIG. 2 is a block diagram illustrating a spacecraft skin, according to an embodiment of the present invention.

FIG. 3 is a block diagram illustrating a battery system, according to an embodiment of the present invention.

DETAILED DESCRIPTION OF THE EMBODIMENTS

Some embodiments pertain to a power system that uses electrical energy harvested from the decay of radioisotopes and also harnesses waste heat. When radioisotopes (e.g., plutonium) decay heat and radiation are generated. For example, with a radioisotope power generator, there is a converter component that converts heat into electrical energy, i.e., the isotope decay generates heat, and heat is converted to electrical energy. Since most of the heat cannot be used, the heat is radiated away as waste heat.

FIG. 1 is a diagram illustrating a battery system 100, according to an embodiment of the present invention. In an embodiment, a radiation hard battery 104 is connected to a bus 102. Also connected to bus 102, and intimately connected to battery 104, is a heat source 106. In some embodiments, a radioisotope power source is used as heat source 106.

In those embodiments, electrical energy generation is combined with radiation hard battery 104 by intimately connecting radiation hard battery 104 with heat source 106. For purposes of explanation, heat source 106 may be referred to as a waste heat generator.

Using space applications as an example, radiation hard battery 104 has to be maintained within an operational temperature range. By situating radiation hard battery 104 around the radioisotope power source (i.e., heat source 106), the heat generated from the radioisotope power source is coupled or in contact with a material 108 that has the thermoelectric effect (i.e., a phenomenon by which a temperature difference creates a voltage potential. These materials have high electrical conductivity, low thermal conductivity and high Seebeck coefficient, e.g. $Bi_2Te_3$ or $Bi_2Se_3$). The thermoelectric material is placed in contact with heat source 106 on one side and to radiation hard battery 104, which is colder by virtue of it being closer to the vacuum of space, on the other side. In some examples, the thermoelectric material is patterned (not shown in FIG. 1) with sections of the thermoelectric material being in contact radiation hard battery 104 and other sections being in contact with a cold surface (as vacuum of space). In this scenario, the regions of the thermoelectric generator that are in contact with colder surface will more efficiently generate electrical power for storage on radiation hard battery 104. In general, it is the generated potential difference which is used to recharge (or power) radiation hard battery 104, or in some embodiments, power bus 102. Other embodiments can use, but are not limited to, other thermopower conversion techniques such as thermophotovoltaics, thermionics, Stirling engines, or other heat to energy conversion technologies.

In certain embodiments, material 108 may also be a direct radiation to energy conversion component. This component may not rely on using heat from the radioisotope decay to generate electricity. Instead, the component may directly convert energetic radiation to electricity. Battery system 100 can still utilize the waste heat from the conversion to warm (or heat) the battery and/or employ a secondary heat to bus 102 or another device while material 108 provides electrical energy to charge battery 104 or power bus 102.

An example of the efficacy of such a system is described as follows. Stontium-90 is known to have a half-life of 28.8 years. After 28.8 years has elapsed, half of the material will have been expended, and half of the material will remain as available fissile material. A power source using 10 mole of Strontium-90 (900 grams, or 6E24 atoms) at beginning of life will, over the course of 28.8 years, emit 450 grams or 3E24 atoms as beta particles having about 0.54 MeV of energy. During that time, the amount of energy released in Joules can be calculated as 3E24*(0.54E6)*1.6E-19 (J/eV) =~2.6E11 J, which can be harnessed using an 8% efficient beta voltaic device to generate 2.4E10 J, or 6.7E6 Wh.

Continuing with this example, a system that requires a 10 W baseload power, the system would be able to perform a high power operation using 600 W for 10 minutes up to 4.2E3 times during the 28.8 years, with declining frequency. Without energy storage of the power coming from the Sr decay, the power system would not be able to operate at $\frac{1}{50}^{th}$ of this max power.

Current technology for powering bus 102 relies on materials that have thermoelectric effect, or materials that have thermophotovoltaic property. Other technology may use the temperature difference between two materials (e.g., a heat engine). The thermoelectric converter embodiment is discussed above. In the thermophotovoltaic embodiment, the radiated heat from heat source is captured (much like a solar cell) and the captured photons are converted to electricity by exciting electrons above a very low bandgap energy material. These materials capture a large fraction of the infrared emissions from a heat source at ~800-1300° C. (typical temperatures from a radioisotope decay source) and convert it to electricity (e.g. poly crystalline silicon carbide and some rare-earth oxides). The efficacy of thermophotovoltaic material is not as dependent on the quality of thermal and physical contact with the heat source, since heat energy is transferred via photons following the black body radiation equation (e.g. Planck's law).

Furthermore, rather than using a separate radiation shield, which can be bulky, radiation hard battery 104 itself acts as a shielding mask. By using radiation hard battery 104 as a shielding mask, the radiation emanating from the radioisotope power source is reduced. This shielding mask essentially shields other components near and/or around radiation hard battery 106 from radiation emanating from the RTG. This allows the radioisotope source to be placed closer to other systems without additional shielding.

As noted earlier, with radioisotope decay, the quantity of the radioisotope decreases with its half-life. For example, if the radioisotope power source has a half-life of ten years, then after ten-years, the mass amount of radiating isotopes has decreased by half by the tenth year. Since the power conversion is directly related to the amount of material that is undergoing fission, the power output also decreases with time. For peak power applications, this poses a problem. However, by placing radiation hard battery 104 near the radioisotope power source, the decay of power in the radioisotope is partially offset by radiation hard battery 104 that is continually being charged (even at a trickle charge levels), which can then be used to conduct a peak power application. The integration of a radioisotope source with radiation hard battery 104 allows for peak power applications to still be conducted, albeit at longer and longer intervals as the radioisotope decays. Without this integration, there exists a threshold in the radioisotope power decay curve after which peak power operations are no longer possible.

Existing energy storage technologies, such as lithium ion storage batteries with polymer or gel separators, or organic electrolytes are sensitive to radiation. For example, organic electrolytes and polymer separators are sensitive to radiation. Any energy storage device that uses polymer components are vulnerable to radiation damage. By using radiation hard components, an energy storage device can collect the energy generated from the radioisotope decay without either destruction of radiation hard battery from the radiation or the need for massive radiation shielding. In addition, conventional lithium ion batteries have a very narrow operational temperature range, typically only 20° C. The radiation hard battery described herein may have a wider operational temperature range, reducing the need to regulate the temperature of the radiation hard battery.

In particular radioisotope power sources that are good neutron generators are dangerous to a lithium battery. For instance, naturally abundant lithium, as a mined element, is a mixture of two stable isotopes—lithium-6 and lithium-7 ($^7$Li). Lithium-7, being the more naturally abundant isotope (~92%), with the lithium-6 being the minority component (~8%). In comparison to lithium-6, lithium-7 is transparent to neutron radiation sources. Lithium-6 (3 protons, 4 neutrons) is a neutron absorber, which breaks down the atomic building blocks forming helium (2 protons, 2 neutrons) and tritium (1 proton, 2 neutrons). With that said, if a lithium ion battery is constructed having a natural abundance of lithium, as neutrons are absorbed in the minority isotope, gas (in the form of Helium) in the battery are generated causing the battery to swell. This gas formation and swelling can result in loss of electrode contact, loss or conversion of active material, venting, or rupture, all of which can lead to poor battery performance. To prevent this from occurring, it is necessary that battery 104 is radiation hardened.

Radiation hard battery 104 includes isotopically pure lithium-7 materials ($^7$LiPON, a ceramic separator/electrolyte, and $^7$LiCoO$_2$ or $^7$LiNCA, cathode materials) that are non-neutron capture elements, for example. The electrode materials are vacuum deposited as thin films and do not employ organic or polymer binder. In addition, organic components (e.g., electrolytes and polymer separators) of a battery are replaced with a ceramic material. The ceramic material is not only radiation hard but can also withstand the high temperatures (>700° C.), and may include $^7$LiPON, for example. This way, radiation hard battery 104 uses lithium-7 to transport the charge from the anode to cathode.

Because ceramic electrolytes operate better at higher temperatures, the ceramic electrolytes can be heated using waste heat (e.g. heat generated from the RTG). Specifically, in some embodiments, waste heat generated from the radioisotope decay of the RTG is used to heat the ceramic electrolytes in radiation hard battery 104. Using this configuration, mass and power consumption are saved because heaters to warm radiation hard battery 104 are no longer needed. The RTG can be scaled down (in both size and power) but power delivery is still maintained as a result of the battery.

In a further embodiment, RTG could send electrical energy to bus 102 directly via a converter material. This allows the spacecraft to have extra electrical energy being supplied by the radiation hard battery 104 and the RTG. This could be used run mission sensors or other electronics (e.g. watchdog timers, things that must be ON all the time).

Spacecraft Skin

The primary source within a RTG is a radioisotope element in the form of an oxide. Since the goal is to extract all the generated heat from the RTG, a structural design that forces the RTG material to be laid out as a large 2-dimensional surface enables the most efficient extraction of the produced heat. The thermal conduction layer (e.g. thermoelectric, thermophotovoltaic or simple thermal transport layer) can also be planarized to match the topography of a flattened RTG. Similarly, battery technology can also be produced in planar fashion and can further be layered as shown in FIG. 2. Layer 202 (labeled as reflector for a particular embodiment) is the top layer that can be a structural support, thermal radiator, or optical radiator (such as shown). The stack from RTG 208 to reflector 202 can be conceived as a multifunctioning "skin" capable of producing power, heat and structural support. In the embodiment shown in FIG. 2 with reflector 202, the "skin" can be part of an optical telescope (physics demands large area and aperture if high optical resolution is desired) or a solar sail propulsion system (a material that uses the photon flux from the sun to propel itself throughout our solar system, e.g. the test spacecraft Nanosail, LightSail, Sunjammer, Ikaros).

FIG. 2 is a block diagram illustrating a spacecraft skin 200, according to an embodiment of the present invention. In some embodiments, a spacecraft skin 200, which is highly reflective, includes a reflector 202 on one side of spacecraft skin 200 and a battery 204 and RTG 208 on the other side of spacecraft skin 208. Missing but assumed is a structural material below the RTG. In one example, when the spacecraft is near Jupiter, extra propulsion may be achieved using battery 204 and RTG 208 concept.

Although not clearly illustrated, numeral 206 includes two layers—a thermal conduction layer and a thermoelectric or thermophotoelectric layer. In some embodiments, the thermal conduction layer guides heat to keep battery 204 warm, and the thermoelectric layer converts the heat emitted from RTG 208 into electricity, which can be stored into battery 204.

In an embodiment, the thermal conduction layer 206 represents efficient transport of heat from RTG 208 to battery 204 or other satellite components, by the proper use of high thermal conductivity materials and patterning. The thermoelectric generator may require physical contact with RTG 208 for the high temperature surface, in some embodiments. The thermophotovoltaic generator may not require, in certain embodiments, physical contact but is positioned to capture the radiant heat that is produced by RTG 208.

It should be appreciated that the battery system is not limited to space, and may be placed terrestrially as well. For example, the battery and RTG system may be incorporated with an earthquake sensor, allowing said earthquake sensor to be buried and operational for tens to hundreds of years (with Pu 238 or Am 241).

In another embodiment, the battery system may be conformal in so far that the battery system (including the RTG) may be any shape and size to fit the purpose of the application, for example a "skin" like topology.

Waste Heat Source

It should be appreciated that the embodiments are not limited to a radioisotope power source. Other waste heat sources may be used as a source to power a bus or to recharge a radiation hard battery. FIG. 3 is a block diagram illustrating a battery system 300, according to an embodiment of the present invention.

In some embodiments, a thermally (not necessarily radiation) hard battery 304 may be connected to a radiator 302 to make the heat transfer more efficient. Thermally hard battery 304 does not have to be radiation hard (e.g., the use of isotopically pure lithium) but it must include ceramic electrolytes if heat source 306 operates above nominal polymer electrolyte temperatures. To provide some context and depending on the application, items or things that may qualify as radiator 302 include air, water, or vacuum. In air, radiator 302 could be a structure with large surface area that is cooled by air or convection (e.g. modern insulated coated windows). If water or cooling fluid is present, then the structure typically has a topology with a large area surface contact (e.g. radiator in car). If it is in vacuum, then it is usually high emissivity material with large area that faces away from other radiative sources (i.e. sun, Earth, vehicle). The Stefan-Boltzmann law is used a guide to design the necessary surface to remove radiant heat. In general radiators are materials that have high thermal conductivity and high thermal emissivity.

On the other side of thermally hard battery 304 is a heat to energy converter ("converter") 308 to convert the heat from heat source 306 into energy. In an embodiment, heat source 306 is intimately connected to converter 308.

To make battery 304 thermally hard, battery 304 includes ceramic separator and electrolyte in some embodiments. Because the ceramic separator and electrolyte are thermally hard, temperature regulators are not required. The ceramic separator and electrolyte, themselves, enable a wide temperature range, which are needed for high temperature operation (e.g., hundreds of degrees Celsius).

Heat source 306 can be radioactive (e.g. RTGs), natural (e.g. geothermal energy, heating vents in the ground, volcanoes, solar heat, steam) or manmade (e.g. internal combustion engine, all motors, turbines). The embodiment includes the utility of converting any waste heat (e.g. electrical) to useful energy (battery), just as long as a temperature differential can be maintained across the heat to energy converter 308.

A high temperature fuel cell operates by catalytic chemistry that converts chemical energy (e.g. hydrogen, methane, methanol) and an oxidizing agent (e.g. oxygen) into electricity through a redox reaction. The catalytic agent (e.g. platinum, manganese dioxide) operates with more efficiency at higher temperatures. Mid-to-high temperature fuel cells can operate between 150 to 1100° C., depending on the electrolyte. There is waste heat generated as not all the heat is consumed by the chemical reagents. This waste heat can be converted into additional electricity by the design shown in FIG. 3.

As noted above, some embodiments use a radiation hard battery (i.e., a battery not using waste fuel), a ceramic separator and electrolyte, and lithium components, using only radiation hard isotopes (e.g., lithium-7), are used. However, in embodiments where there is no radiation source, lithium-7 may not be required, and in those embodiments, a ceramic separator (which can operate at higher temperatures) and organic electrolytes and separators and mixed lithium-6 and lithium-7 components may be used depending on the operating temperature.

In an embodiment, a power generation/storage system includes a battery intimately connected to a heat source. The battery may harvest waste heat from the heat source to warm the battery, while storing electrical energy produced by a thermoelectric or other heat to electric transforming engine.

The power generation/storage system also includes thermoelectric material in contact with the battery on one side and in contact with the heat source on another side. The thermoelectric material may convert the heat from the heat source into energy for storage into the battery.

In some embodiments, the battery is a radiation hard battery acting as a shielding mask against radiation emanating from the heat source. This radiation hard battery may include isotopically pure lithium-7 material to transport electrical charge from an anode to a cathode, and ceramic electrolytes to be heated using the waste heat. Further, the radiation hard battery may use a radiation hard isotope to resist radiation emanating from the waste heat source. In some embodiments, the waste heat source is a radioisotope power source generating waste heat and radiation as the radioisotope power source decays in power over time.

The power generation/storage system may also include a thermal conduction layer configured to guide heat to the battery, keeping the battery warm, and may also include a thermoelectric layer configured to convert heat emitted from the heat source into energy to be stored within the battery.

In another embodiment, a power generation/energy storage system includes a radiation hard battery intimately connected to a waste heat source, configured to harvest waste heat from the heat source to warm the radiation hard battery, while storing electrical energy produced by a thermoelectric or other heat to electric transforming engine.

In some embodiments, the radiation hard battery is configured to shield radiation emanating from the heat source. The radiation hard battery may include a ceramic separator and an electrolyte to support a wide range of temperatures emanating from the heat source. The radiation hard battery may also use a radiation hard isotope to resist radiation emanating from the waste heat source. The waste heat source is a radioisotope power source generating waste heat and radiation as the radioisotope power source decays in power over time. Further, waste heat source is connected to a heat to energy conversion device and is configured to power the electrical bus or the other device from the waste heat.

In certain embodiments, the waste heat generated from the radioisotope power source is coupled or in contact with a thermoelectrical material. The thermoelectric material is placed in contact with the radioisotope power source on one side and to the radiation hard battery on the other side.

In yet another embodiment, a battery system includes a bus connected to a radiation hard battery and a radioisotope power source. The radiation hard battery is connected to the radioisotope power source, such that heat generated from the radioisotope power source is converted into energy and stored into the radiation hard battery.

The battery system may also include thermoelectric material configured to convert the heat from the radioisotope power source into energy. The energy in some embodiments is used to power the bus, is stored in the radiation hard battery, or both. Further, in some embodiments, the thermoelectric material is placed between the radiation hard battery and the radioisotope power source.

In certain embodiments, the radiation hard battery comprises isotopically pure lithium-7 material and ceramic electrolytes.

The battery system may also include a radiation to energy conversion component configured to convert energetic radiation to electricity, allowing the battery system to harvest the emitted radiation directly and contain it in a battery without the generation of heat.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A power generation and storage system, comprising:
a battery intimately connected to a heat source, the battery configured to harvest waste heat from the heat source to warm the battery while storing electrical energy produced by a thermoelectric material or other heat to electric transforming engine, wherein
the heat source is a radioisotope power source generating waste heat and radiation as the radioisotope power source decays in power over time.

2. The power generation and storage system of claim 1, wherein
the thermoelectric material is in contact with the battery on one side and is in contact with the heat source on another side, wherein
the thermoelectric material is configured to convert the heat from the heat source into electrical energy for storage into the battery.

3. The power generation and storage system of claim 1, wherein the battery is a radiation hard battery acting as a shielding mask against radiation emanating from the heat source.

4. The power generation and storage system of claim 3, wherein the radiation hard battery comprises isotopically pure lithium-7 material to transport electrical charge from an anode to a cathode, and ceramic electrolytes to be heated using the waste heat.

5. The power generation and storage system of claim 3, wherein the radiation hard battery uses a radiation hard isotope to resist radiation emanating from the waste heat source.

6. The power generation and storage system of claim 1, wherein the thermoelectric material comprises:
a thermal conduction layer configured to guide heat to the battery, keeping the battery warm.

7. The power generation and storage system of claim 6, wherein the thermoelectric material comprises:
a thermoelectric layer configured to convert heat emitted from the heat source into electrical energy to be stored within the battery.

8. A power generation and energy storage system, comprising:
a radiation hard battery intimately connected to a heat source, the battery configured to harvest waste heat from the heat source to warm the radiation hard battery; while storing electrical energy produced by a thermoelectric material or other heat to electric transforming engine, wherein
the heat source is a radioisotope power source generating waste heat and radiation as the radioisotope power source decays in power over time.

9. The system of claim 8, wherein the radiation hard battery is configured to shield radiation emanating from the heat source.

10. The system of claim 9, wherein the radiation hard battery comprises a ceramic separator and an electrolyte to support a wide range of temperatures emanating from the heat source.

11. The system of claim 9, wherein the radiation hard battery uses a radiation hard isotope to resist radiation emanating from the heat source.

12. The system of claim 8, wherein the heat source is connected to a heat to energy conversion device, the heat to energy conversion device is configured to use the waste heat to power an electrical bus or another device.

13. The system of claim 8, wherein the waste heat generated from the radioisotope power source is coupled or in contact with the thermoelectric material.

14. The system of claim 13, wherein the thermoelectric material is placed in contact with the radioisotope power source on one side and with the radiation hard battery on the other side.

15. A battery system, comprising:
a bus connected to a radiation hard battery and a radioisotope power source, wherein
the radiation hard battery is connected to the radioisotope power source, such that heat generated from the radioisotope power source is converted into electrical energy, wherein the electrical energy is stored into the radiation hard battery.

16. The battery system of claim 15, further comprising:
a thermoelectric material configured to convert the heat from the radioisotope power source into electrical energy, wherein the electrical energy is used to power the bus.

17. The battery system of claim 16, wherein the thermoelectric material is placed between the radiation hard battery and the radioisotope power source.

18. The battery system of claim 15, wherein the radiation hard battery comprises isotopically pure lithium-7 material and ceramic electrolytes.

19. The battery system of claim 15, further comprising:
a radiation to energy conversion component configured to convert energetic radiation to electricity allowing the battery system to harvest the radiation directly and contain it in a battery without the generation of heat.

* * * * *